(12) United States Patent
Wieczorek et al.

(10) Patent No.: US 6,593,197 B2
(45) Date of Patent: Jul. 15, 2003

(54) SIDEWALL SPACER BASED FET ALIGNMENT TECHNOLOGY

(75) Inventors: Karsten Wieczorek, Boxdorf (DE); Manfred Horstmann, Dresden (DE); Rolf Stephan, Dresden (DE); Michael Raab, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 32 days.

(21) Appl. No.: 09/811,733

(22) Filed: Mar. 19, 2001

(65) Prior Publication Data

US 2002/0048890 A1 Apr. 25, 2002

(30) Foreign Application Priority Data

Oct. 20, 2000 (DE) .......................... 100 52 208

(51) Int. Cl.[7] .............................. H01L 21/336
(52) U.S. Cl. .................. 438/303; 438/305; 438/230
(58) Field of Search ................... 438/305, 302, 438/197, 230, 525, 231, 303, 301

(56) References Cited

U.S. PATENT DOCUMENTS

| | | | | |
|---|---|---|---|---|
| 4,963,502 A | * | 10/1990 | Teng et al. .................... 437/41 |
| 5,173,439 A | * | 12/1992 | Dash et al. .................... 437/67 |
| 5,721,443 A | * | 2/1998 | Wu .............................. 257/344 |
| 5,956,590 A | * | 9/1999 | Hsieh et al. .................. 438/303 |
| 6,017,801 A | * | 1/2000 | Youn ............................ 438/296 |
| 6,218,250 B1 | | 4/2001 | Hause et al. ................. 438/302 |
| 6,221,564 B1 | * | 4/2001 | Jeng et al. .................... 430/319 |
| 6,255,182 B1 | | 7/2001 | Wieczorek et al. ......... 438/305 |
| 6,255,703 B1 | | 7/2001 | Hause et al. ................. 257/384 |
| 6,268,257 B1 | | 7/2001 | Wieczorek et al. ......... 438/305 |
| 6,316,322 B1 | * | 11/2001 | Hao ............................. 438/305 |
| 6,423,634 B1 | | 7/2002 | Wieczorek et al. ......... 438/655 |
| 2001/0024847 A1 | * | 9/2001 | Snyder | |
| 2001/0031536 A1 | * | 10/2001 | Shenoy | |
| 2002/0056887 A1 | * | 5/2002 | Horstmann et al. | |

OTHER PUBLICATIONS

Wolf and Tauber; Silicon Processing for the VLSI Era Volume 1: Process Technology; p. 198; copyright 1986; Lattice Press; Sunset Beach, CA.*
U.S. patent application Ser. No. 09/810,771, Wieczorek et al., filed Mar. 16, 2001.
U.S. patent application Ser. No. 10/210,637, Wieczorek et al., filed Jul. 31, 2002.

* cited by examiner

*Primary Examiner*—Olik Chaudhuri
*Assistant Examiner*—Fernando Toledo
(74) *Attorney, Agent, or Firm*—Williams, Morgan & Amerson, P.C.

(57) ABSTRACT

This invention provides methods of forming a field-effect transistor in an integrated circuit using self-aligning technology on the basis of a sidewall spacer masking procedure, both for defining the device isolation features and the source and drain regions. The active region is defined after patterning the gate electrode by means of deposition and etch processes instead of overlay alignment technique. Thus, the present invention enables an increase of the integration density of semiconductor devices, a minimization of the parasitic capacitances in field-effect transistor devices, and a quicker manufacturing process.

29 Claims, 5 Drawing Sheets

SIDEWALL SPACER BASED FET ALIGNMENT TECHNOLOGY

BACKGROUND OF THE INVENTION

1. Field of the Invention

The present invention relates to a method of producing a semiconductor device using sidewall spacers to obtain alignment of overlying device features. The present invention in particular relates to a method of producing a field-effect transistor using sidewall spacers on a semiconductor substrate for adjusting the position of an active region with respect to a gate electrode without realigning steps during the production process.

2. Description of the Related Art

The manufacturing process of integrated circuits involves the fabrication of numerous insulated gate field-effect transistors, such as metal-oxide semiconductor field-effect transistors (MOSFETs). In order to increase integration density and improve device performance, for instance, with respect to signal processing time and power consumption, feature sizes of the transistor structures are steadily decreasing. Most importantly, not only the gate length but also the length of the active region of the fabricated transistors needs to be reduced to comply with these requirements in order to reduce parasitic source and drain capacitances.

Conventionally, device features are defined and delineated by lithographic techniques, in particular photolithography, preferably using a high numerical aperture lens and a deep ultraviolet (DUV) light source. Current DUV lithography reaches its resolution limit at a feature size of approximately 0.2 $\mu$m. Together with emerging gate length trim techniques, it is possible to reach device features in the sub-100 nm region. Such feature definition by lithography requires a plurality of process steps, each usually involving a resist mask technique. Overlay alignment of subsequent resist masks using special alignment features on the semiconductor substrate requires exact positioning of a mechanical stage supporting the substrate. Desirably, the overlay accuracy is considerably higher than the smallest feature size, preferably, at least one order of magnitude.

However, mechanical alignment of the various resist mask layers necessary for production of a field-effect transistor (FET) structure having a gate length of approximately 0.1 $\mu$m is very difficult to achieve due to the mechanical nature of the overlay alignment process.

To comply with the general requirements of mass production of semiconductor devices, any new technology must conserve the current standards of efficiency, reliability, and cost of already existing methods or provide improvements in this respect.

As mentioned above, the formation of the active region relative to the gate electrode is a critical step in the manufacturing process of a field-effect transistor. The gate length dimension, i.e., the lateral extension of the gate electrode between the source region and drain region of the field-effect transistor, is commonly known as critical dimension of the gate. This critical dimension is desirably reduced to sizes approaching or even exceeding the resolution limit of the optical imaging systems used for patterning the device features. In a field-effect transistor such as a MOSFET, the gate is used to control an underlying channel formed in the semiconductor substrate between source region and drain region. Channel, source region, and drain region are formed in, on, or over a semiconductor substrate which is doped inversely to the drain and source regions. The gate electrode is separated from the channel, the source region, and the drain region, by a thin insulating layer, generally by an oxide layer. Additionally, device insulation features are necessary to ensure electrical isolation between neighboring field-effect transistors in integrated circuits.

During operation of such a MOSFET, a voltage is supplied to the gate electrode in order to create an electric field between the gate electrode and the source and drain regions affecting conductivity in the channel region of the substrate. Besides the desired transistor current control function, the gate electrode, the gate insulation layer, and the regions underlying the gate insulation layer, also act as a capacitor generating a parasitic capacitance. The amount of this parasitic capacitance depends on the feature size of the gate electrode. Most commonly in integrated circuit applications, the transistors are operated in a switching mode with clock frequencies currently as high as 400 to 500 MHz. In this operation mode, the gate capacitor has to be continuously charged and discharged, which significantly affects signal performance and power consumption of the device.

Moreover, the electric field between the source region and the drain region generates an additional parasitic capacitance. The amount of this additional parasitic capacitance depends on the sizes of the source region and of the drain region. This additional parasitic capacitance also significantly affects signal performance and power consumption of the semiconductor device. Decreasing sizes of the source region and of the drain region will reduce the additional parasitic capacitance. Decreasing source and drain regions, however, require difficult aligning steps during the photolithography for patterning the gate electrode, and, thus, lead to a deterioration of device characteristics due to an unavoidable misalignment of the gate electrode with respect to the source and drain regions because of the mechanical nature of the alignment step.

Due to the limitations of standard photolithography including mechanical alignment used to pattern and position the gate electrode within the active transistor region in which the drain and source have to be formed, advanced techniques for trimming the gate electrode will neither be translated into a decreasing size of the active region and, thus, into reduced source and drain regions, nor into reduced source and drain capacitances nor into an increased circuit-density.

As the dimensions of the transistor significantly influence its electrical characteristics, when decreasing device dimensions it is important to provide a method of reliably and reproducibly forming and positioning device features and device insulation features in order to minimize variations in the electrical characteristics of integrated circuits.

Figure 1A:
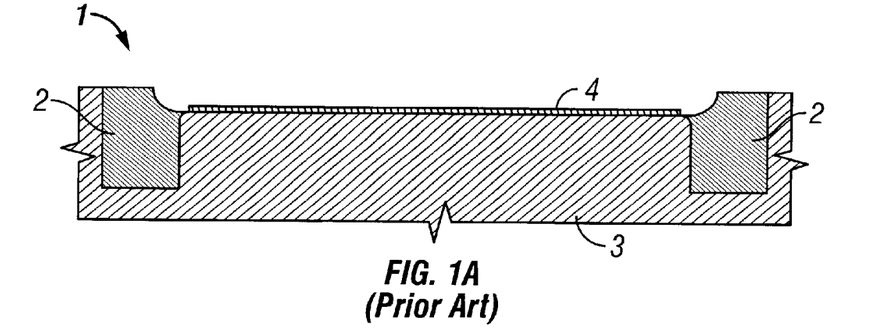
FIGS. 1a–1c are schematic cross-sectional views of a semiconductor substrate in different process steps during production of a field-effect transistor according to the prior art.
Figure 1B:
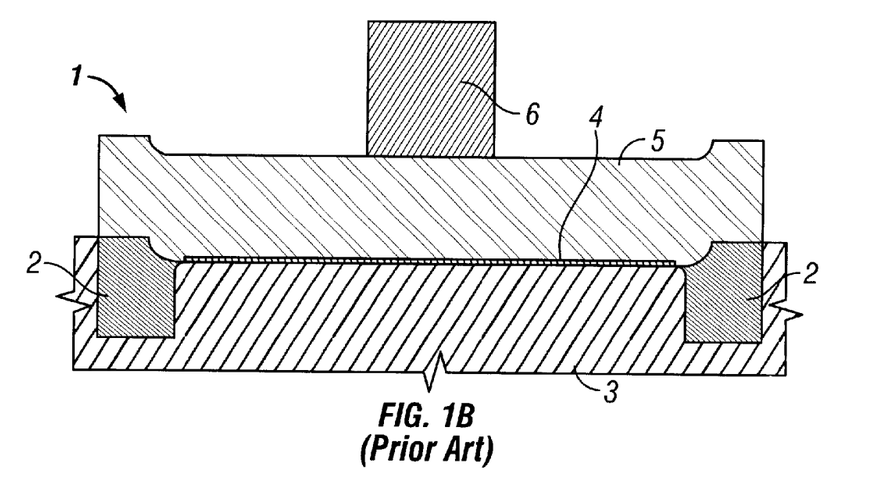
Figure 1C:
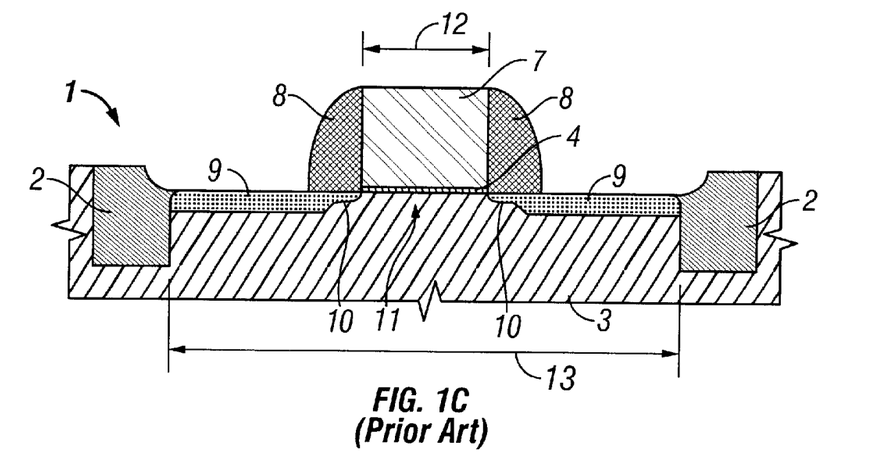

With reference to FIGS. 1a–1c, an illustrative example of forming a field-effect transistor according to a typical prior art process will be described. It is to be noted that FIGS. 1a–1c, as well as the following drawings in this application, are merely schematic depictions of the various stages in manufacturing the illustrative device under consideration. The skilled person will readily appreciate that the dimensions shown in the figures are not true to scale and that different portions or layers are not separated by sharp boundaries as portrayed in the drawings but may instead comprise continuous transitions. Furthermore, various process steps as described below may be performed differently depending on particular design requirements. Moreover, in this description, only the relevant steps and portions of the device necessary for the understanding of the present invention are considered.

FIG. 1a shows a schematic cross-section of a field-effect transistor at a specific stage of a typical prior art manufacturing process. Within a silicon substrate 1, shallow trenches 2, e.g., made of silicon dioxide, are formed and define a transistor active region 3 in which a channel, a drain region and a source region will be formed. A gate insulation layer 4 is formed above the substrate 1. The gate insulation layer 4 may be formed by a variety of techniques, e.g., thermal growth, chemical vapor deposition (CVD), etc., and it may be comprised of a variety of materials, e.g., an oxide, an oxynitride, silicon dioxide, etc.

FIG. 1b shows a schematic cross-section of the field-effect transistor of FIG. 1a after formation of a layer of gate electrode material 5 above the gate insulation layer 4. The layer of gate electrode material 5 may be formed from a variety of materials, e.g., polysilicon, a metal, etc., and it may be formed by a variety of techniques, e.g., CVD, low pressure chemical vapor deposition (LPCVD), sputter deposition, etc. Over the layer of gate electrode material 5, a resist feature 6 is formed. The process steps involved in patterning a layer of resist (not shown) for producing the resist feature 6 are of common knowledge to the skilled person. These steps include the formation of the layer of resist by a spin-coating process, and the employment of short exposure wavelengths, such as wavelengths in the DUV range, while performing the required photolithography steps. Since these procedures are commonly known, the description thereof will be omitted.

FIG. 1c shows a schematic cross-section of the field-effect transistor of FIG. 1b after conventional etching of the layer of gate electrode material 5 and after removing all remaining parts of resist feature 6. As a result of these process steps, a gate electrode 7 is obtained. Lightly doped drain (LDD) regions 10 are then formed in the active region 3 by a shallow ion implantation with a low dose before the formation of sidewall spacers 8. Next, the sidewall spacers 8 are formed adjacent the gate electrode 7. Thereafter, source and drain regions 9 are formed by a deep ion implantation with a high dose. The implanted ions are electrically activated by rapid thermal annealing (RTA). In order to form the sidewall spacers 8 adjacent to the gate electrode 7, silicon dioxide ($SiO_2$) was blanket deposited and subsequently anisotropically etched. According to the conventional fabrication process as described above, drain and source regions 9 are limited by lightly doped drain and source regions 10, which connect to a channel 11. The transverse dimension of the gate electrode 7 defines a critical dimension 12, and the transverse dimension of the active region 3 defines a length dimension 13.

Since the source and drain regions 9 are defined by overlay alignment, i.e., mechanical alignment, in the various lithographic steps while forming the gate electrode, it is extremely difficult to decrease the length dimension 13 due to the mechanical nature of the alignment procedure. Therefore, advanced techniques for a desired down-sizing of the gate electrode 7 will not necessarily allow a corresponding scaling of the drain and source regions, and, thus, may not be translated into an increased circuit density or into reduced source and drain capacitances.

In view of the above-mentioned problems, a need exists for an improved method for forming the source region, the drain region, and the gate electrode of field-effect transistors on semiconductor substrates and to precisely align the gate electrode within the active region.

SUMMARY OF THE INVENTION

The present invention provides methods of forming a field-effect transistor in an integrated circuit using self-aligning technology on the basis of a gate electrode and sidewall spacer masking procedure both for forming the device isolation features and the source and drain regions.

According to a first embodiment of the invention there is provided a method of forming a field-effect transistor in an integrated circuit comprising the steps of providing a semiconductor substrate having a surface, forming a gate electrode over the surface, the gate electrode having a gate width and sidewalls along its width direction, forming first sidewall spacers having a first lateral extension along the sidewalls of the gate electrode, removing portions of the semiconductor substrate adjacent the first sidewall spacers, using the first sidewall spacers as a masking material for defining trenches and an active region, and forming device insulation features at the trenches.

According to a second embodiment of the invention there is provided a method of forming a field-effect transistor in an integrated circuit comprising the steps of providing a semiconductor substrate having a surface, forming a thin insulating layer over the surface, forming a gate electrode over the thin insulating layer, the gate electrode having a gate length direction and sidewalls along a gate width direction, forming a gate cover layer over the gate electrode and first sidewall spacers along the sidewalls of the gate electrode, the first sidewall spacers having a first lateral extension, masking and etching the gate cover layer and the first sidewall spacers so as to remove the first sidewall spacers along the gate length direction while maintaining the first sidewall spacers along the gate width direction, removing material of the semiconductor substrate adjacent the first sidewall spacers and the gate electrode, using the first sidewall spacers and the gate cover layer as a masking material for defining trenches and an active region, growing a thin thermal oxide film in the trenches for the benefit of trench corner rounding, filling the trenches with insulating material, polishing the insulating material back until the gate cover layer is exposed, etching the insulating material isotropically back, removing the gate cover layer and the first sidewall spacers, forming second sidewall spacers along the sidewalls of the gate electrode, the second sidewall spacers having a second lateral extension which is less than the first lateral extension, and forming source and drain regions in the active region.

The present invention as outlined above enables one to fabricate a transistor device having reduced device dimensions, wherein the active region, as well as device insulation features, are aligned with respect to the gate electrode without any overlay steps. With the production method provided by this invention, the active region of a field-effect transistor may be tuned to minimum desired dimensions regardless of lithographic restrictions. Consequently, a drastically increasing circuit density and decreasing parasitic capacitances can be reached.

This invention will enable a significant reduction of field-effect transistor dimensions in integrated circuits and, therefore, a significant cost reduction in manufacturing in semiconductor industries can be achieved.

BRIEF DESCRIPTION OF THE DRAWINGS

Further advantages and objects of the present invention will become more apparent with the following detailed description when taken with reference to the accompanying drawings in which.

While the present invention is described with reference to the embodiment as illustrated in the following detailed description as well as in the drawings, it should be understood that the following detailed description as well as the drawings are not intended to limit the present invention to the particular embodiment disclosed, but rather the described embodiment merely exemplifies the various aspects of the present invention, the scope of which is defined by the appended claims.

DETAILED DESCRIPTION OF THE INVENTION

Further advantages and objects of the present invention will become more apparent with the following detailed description and the appended claims. Furthermore, it is to be noted that although the present invention is described with reference to the embodiments as illustrated in the following detailed description, it should be noted that the following detailed description is not intended to limit the present invention to the particular embodiments disclosed, but rather the described embodiment merely exemplifies the various aspects of the present invention, the scope of which is defined by the appended claims.

Figure 2A:
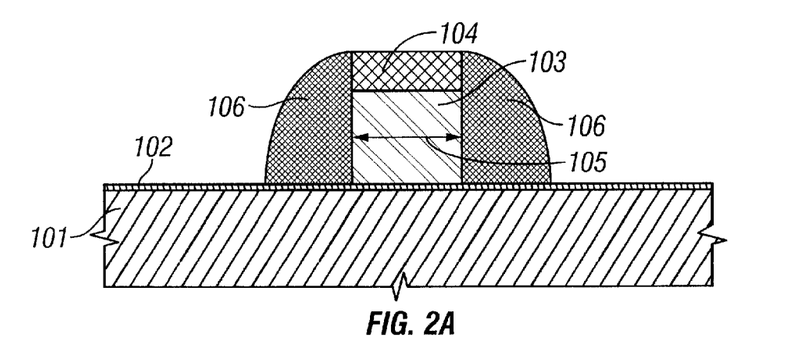
FIG. 2a is a schematic cross-sectional view of a semiconductor substrate after gate electrode formation, gate cover layer formation, and sidewall spacer formation during production of a field-effect transistor according to this invention.

With reference to FIGS. 2a–2i, an illustrative example of forming a field-effect transistor according to one embodiment of the present invention will be described. FIG. 2a shows a schematic cross-section of a field-effect transistor at a specific stage of a manufacturing process according to the present invention. The structure shown in FIG. 2a includes a gate insulation layer 102, comprised of, for example, silicon dioxide ($SiO_2$), formed over a semiconductor substrate 101, comprised of Si, Ge, or the like, a gate electrode 103 having a gate length 105 and formed above the gate insulation layer 102, a gate cover layer 104 positioned over the gate electrode 103, and a sidewall spacer 106 formed around the sidewalls of the gate electrode 103 and the gate cover layer 104. The sidewall spacer 106 and the gate cover layer 104 may preferably be comprised of a material such as silicon nitride (SiN) that can selectively be etched with respect to the semiconductor material of the substrate.

The process steps involved in patterning a resist (not shown) for producing the gate electrode 103, the gate cover layer 104, and the sidewall spacers 106 are of common knowledge to the skilled person, and usually include the employment of short exposure wavelengths, such as wavelengths in the DUV range, while performing the required photolithography steps. According to the anisotropic etching necessary for formation of the sidewall spacers 106, due to a relation of sidewall height to spacer thickness at the bottom, depending on the slope of the sidewall spacers 106, their lateral extension can be determined by the thickness of the gate cover layer 104. Hence, by increasing the sidewall height, substantially thicker sidewall spacers 106 can be formed, employing a standard anisotropic etch process for sidewall spacer formation, which otherwise is commonly known, so that the detailed description thereof will be omitted.

Figure 2B:
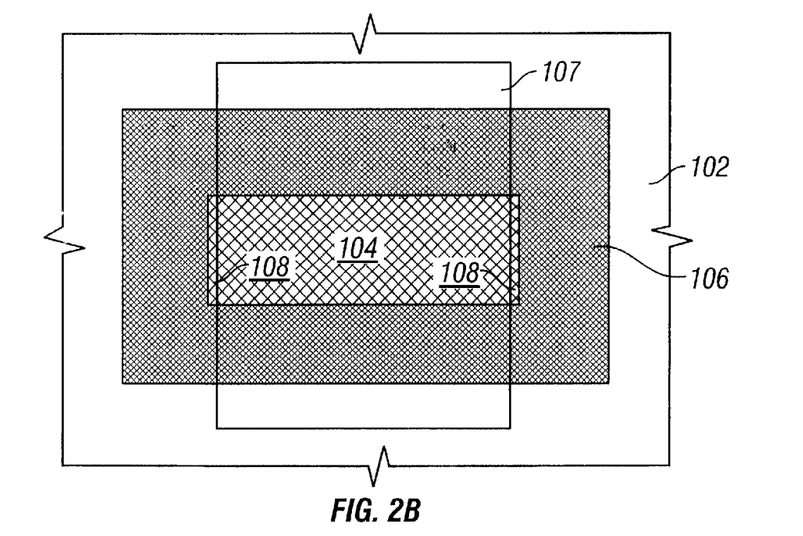
FIG. 2b is a schematic top view of the semiconductor substrate after forming a mask over said gate cover layer and said sidewall spacers during production of the field-effect transistor according to this invention.

FIG. 2b shows a schematic top view of the field-effect transistor of FIG. 2a after deposition of a mask 107 over the gate cover layer 104, over the sidewall spacers 106, and over the thin gate insulation layer 102. The deposition of this mask 107 is made such that both end caps 108 of the gate cover layer 104, and, therefore, both end caps of the gate electrode 103, and all remaining parts of the sidewall spacers 106 around the end caps 108, are exposed. All the exposed parts have to be selectively removed until the thin gate insulation layer 102 is exposed (not shown) resulting in two opposing sidewall spacers 106 in both directions of the gate length 105.

Figure 2C:
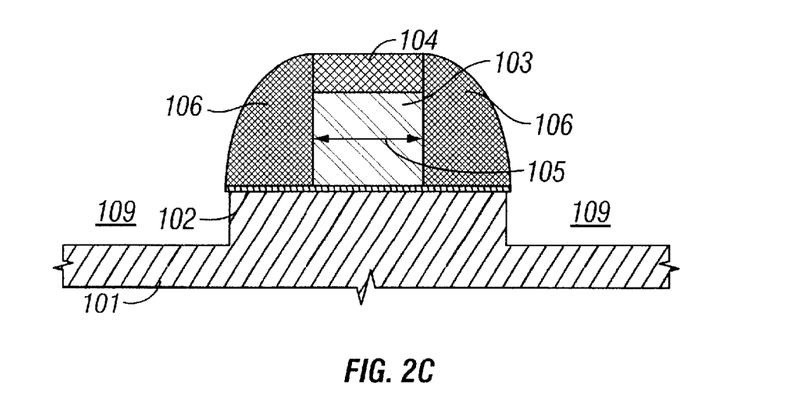
FIG. 2c is a schematic cross-sectional view of the semiconductor substrate after active region formation and mask removal during production of the field-effect transistor according to this invention.

FIG. 2c shows a schematic cross-section of the field-effect transistor of FIG. 2b after conventional etching all parts of the thin gate insulation layer 102, as well as the substrate 101, which are not covered with the gate cover layer 104 or the sidewall spacers 106, and thereby forming trenches 109. These trenches 109 are needed for shallow trench isolations (STIs), as described below.

Figure 2D:
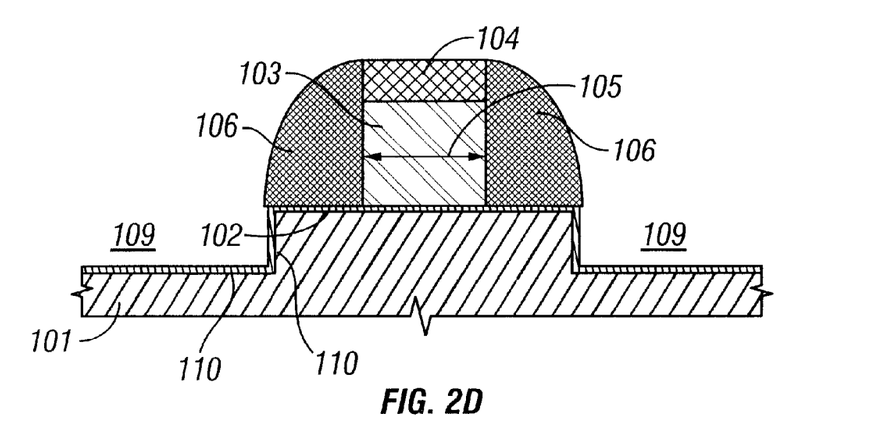
FIG. 2d is a schematic cross-sectional view of the semiconductor substrate after thermal oxide layer formation during production of the field-effect transistor according to this invention.

FIG. 2d shows a schematic cross-section of the field-effect transistor of FIG. 2c after growing a thin thermal oxide layer 110, which is of benefit to trench corner rounding.

Figure 2E:
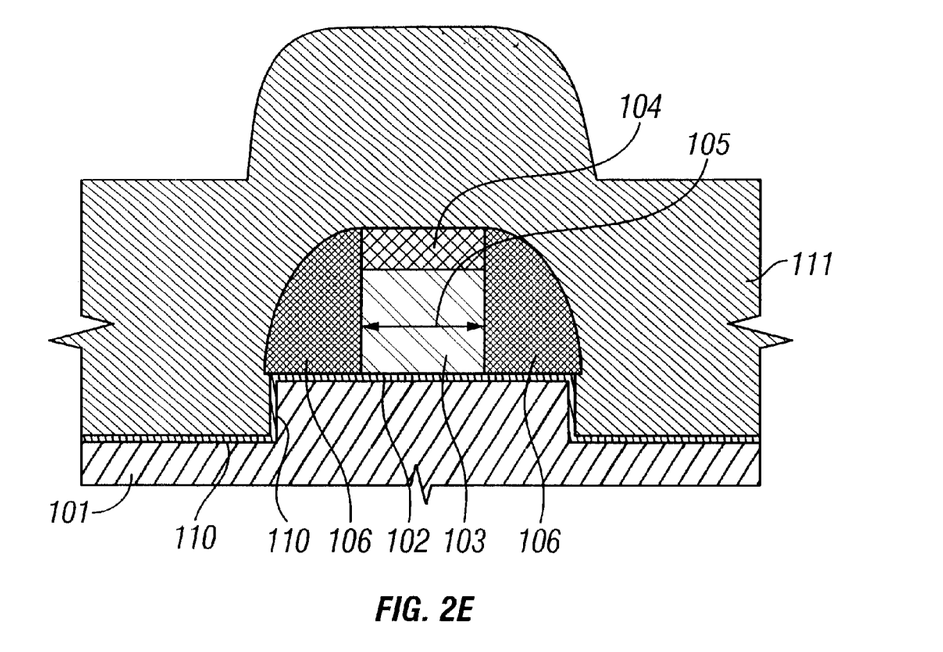
FIG. 2e is a schematic cross-sectional view of the semiconductor substrate after trench filling with insulating material during production of the field-effect transistor according to this invention.

FIG. 2e shows a schematic cross-section of the field-effect transistor of FIG. 2d after an insulating material layer 111, comprised of, for example, silicon dioxide ($SiO_2$), is formed over the field-effect transistor depicted in FIG. 2d. This covering step, including overfilling, is needed for a secure filling of the trenches 109 for the shallow trench isolations (STIs) with necessary insulating material.

Figure 2F:
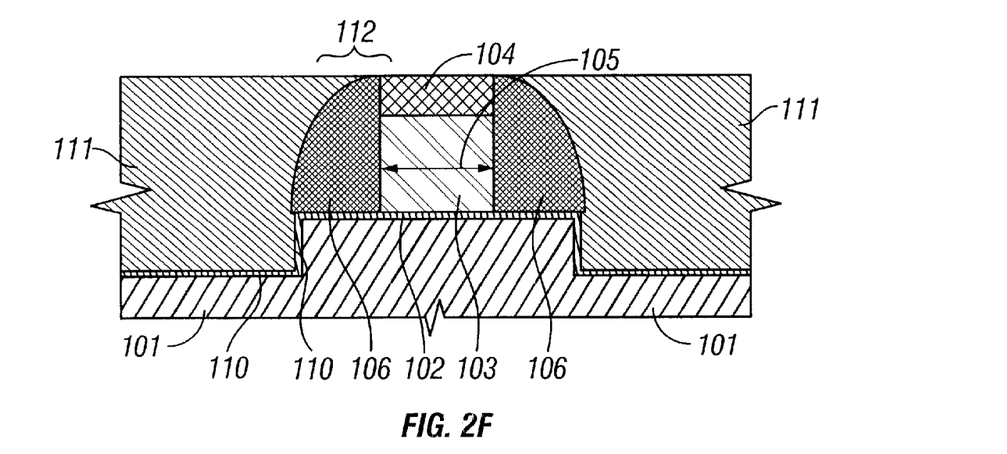
FIG. 2f is a schematic cross-sectional view of the semiconductor substrate after polishing during production of the field-effect transistor according to this invention.

FIG. 2f shows a schematic cross-section of the field-effect transistor of FIG. 2e after polishing said insulation layer 111 to a plane level 112. This polishing process is executed until just a top part of the gate cover layer 104 is exposed.

Figure 2G:
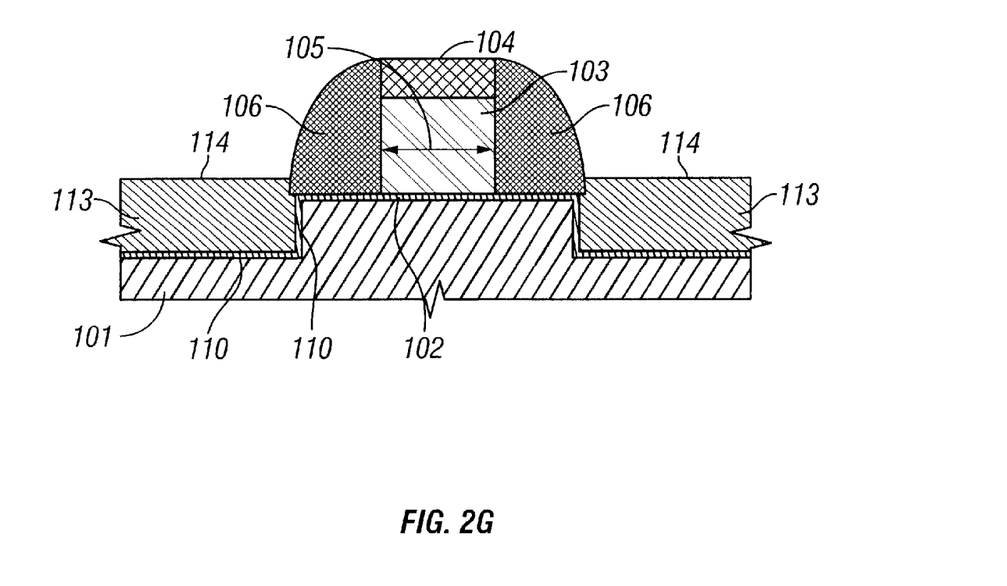
FIG. 2g is a schematic cross-sectional view of the semiconductor substrate after isotropic etching the insulating material during production of the field-effect transistor according to this invention.

FIG. 2g shows a schematic cross-section of the field-effect transistor of FIG. 2f after isotropically etching the insulation layer 111. This etching process results in completed shallow trench isolations (STIs) 113 with a top surface 114 that is located above the gate insulation layer 102 for the benefit of a reduced probability of shorts to the drain and source regions to be formed. Such shorts may occur due to the relatively small overlap of the end caps 108 with the shallow trench isolations 113. Preferably, the top surface 114 is located above the gate insulation by at least an amount that ensures compensation for oxide consumption of the shallow trench isolation 113 during subsequent process steps.

Figure 2H:
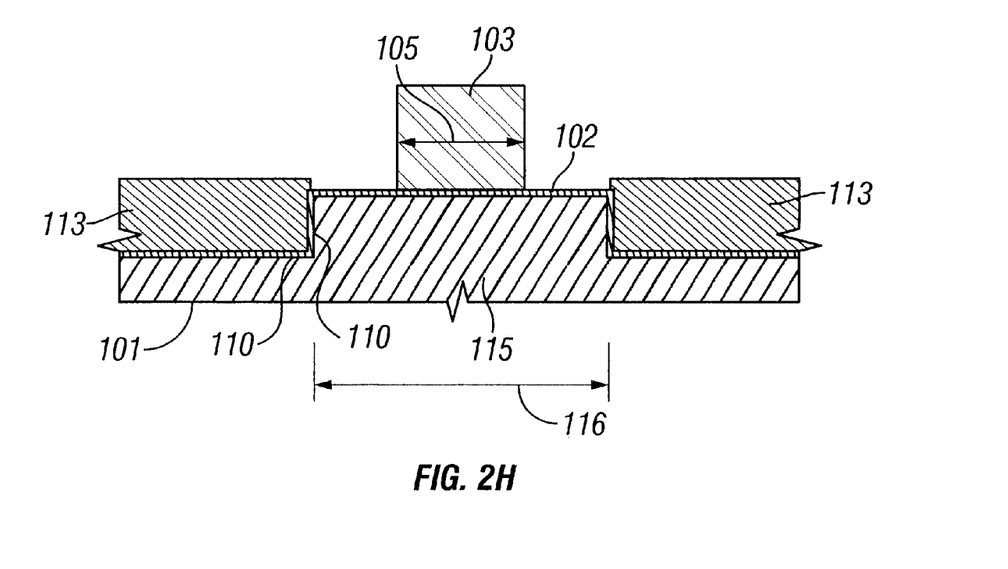
FIG. 2h is a schematic cross-sectional view of the semiconductor substrate after sidewall spacer removal and gate cover layer removal during production of the field-effect transistor according to this invention.

FIG. 2h shows a schematic cross-section of the field-effect transistor of FIG. 2g after removing the gate cover layer 104 and the sidewall spacers 106. The shallow trench isolations (STIs) 113 define an active region 115 with a length dimension 116 in the substrate 101. The length dimension 116 is defined by the length dimension 105 of the gate electrode and the bottom thickness of the sidewall spacers 106. That is, both the length and the location of the active region are determined by well-controllable deposition and etching processes without the necessity of any additional (mechanical) aligning steps. This will hereinafter also be referred to as self-aligned. Moreover, since the length and the location of the active region with respect to the gate electrode are related to the gate length, a down-scaling of the gate length may also be translated in a corresponding down-scaling of the active region. Furthermore, for a given gate length, the length dimension of the active region may be controlled by adjusting the thickness of the sidewall spacers so that a length of the drain and source regions may be controlled in accordance to design requirements irrespective from the channel length (gate length).

Figure 2I:
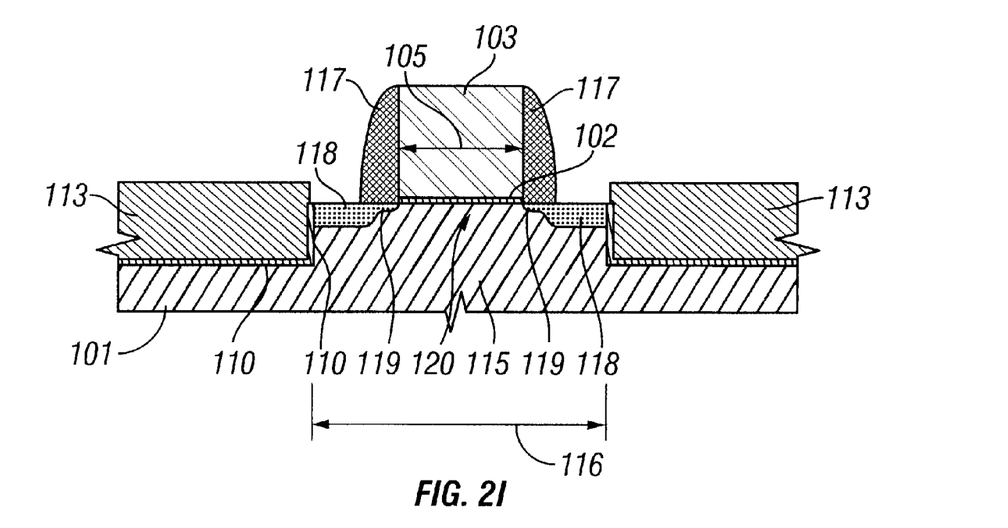
FIG. 2i is a schematic cross-sectional view of the semiconductor substrate after completion of the field-effect transistor according to this invention.

Finally, FIG. 2i shows a schematic cross-section of the field-effect transistor of FIG. 2h after conventional device processing is performed to complete the field-effect transistor. Lightly doped drain (LDD) and source regions 119 were formed in the active region 115 by a shallow ion implantation with a low dose. The implanted ions are diffused by rapid thermal annealing (RTA) so as to partially extend in the area below the thin gate oxide layer 102. Silicon dioxide ($SiO_2$), or other similar material, was blanket deposited and subsequently anisotropically etched in order to form sidewall spacers 117 adjacent to the gate electrode 103 and to the lightly doped drain and source regions 119. Thereafter, source and drain regions 118 are completed by a deep ion implantation with a high dose. The source and drain regions 118 are limited by the lightly doped drain and source regions 119, which connect to a channel 120.

After the formation of the gate electrode 103, the gate insulation layer 102, the active region 115, and the shallow trench isolations (STIs) 113, manufacturing of the field-effect transistor is continued by commonly known standard techniques. Since these techniques are known to the skilled person, the production steps for these standard techniques are not described in this description.

The present invention provides a method of forming a field-effect transistor in an integrated circuit, wherein the source region and the drain region are self-aligned with respect to the gate electrode, i.e., the gate electrode is substantially centrally positioned within the active region without the need of a separate aligning step. Additionally, the transistor length, particularly the source length and the drain length, can be reduced, regardless of the critical dimension of the gate electrode. Hence, the source and drain lengths may be optimized in conformity with design requirements so as to significantly reduce the parasitic capacitances as well as the circuit-density. Therefore, the overall product performance is improved and the production costs are reduced.

Due to the self-alignment technique of the shallow trench isolations (STIs) 113 and of the active region 115 relative to the gate electrode 103 as described above, the length dimension 116 of the active region 115 may be tuned to minimum desired dimensions without lithographic processing and therefore without lithographic restrictions. Thus, the production of field-effect transistors according to the present invention requires less masks as compared to conventional processing for the benefit lower production cost.

According to a modification of the above-described embodiment of the present invention, the first sidewall spacers 106 are formed without the gate cover layer 104 over the gate electrode 103. In order to achieve sidewall spacers 106 of sufficient bottom thickness for defining the active region 115, the process for depositing the spacer material and/or the anisotropic etch process for forming the sidewall spacers 106 is accordingly adjusted to lead to spacer flanks of a shallower slope so as to achieve a greater thickness to height ratio of the sidewall spacers 106. Since anisotropic etching and depositing of material layers are well-controllable within a range of few nm to several $\mu$m, any desired bottom thickness is adjustable so that corresponding drain and source lengths may be manufactured.

According to another modification of the above-described embodiment of the present invention, the sidewall spacers 106 are not removed after the formation of the active region 115. In this case, the sidewall spacers 106 are trimmed, e.g., by an etch process, yielding sidewall spacers 117 having a shorter lateral extension than the sidewall spacers 106. Afterwards, the lightly doped drain and source regions 119 will be formed in the active region 115 under said sidewall spacers 117 by diffusion of ions or by oblique ion implantation with a low dose. Thereafter, source and drain regions 118 are formed by a deep ion implantation with a high dose. The remaining production steps according to the above-mentioned embodiment describing the drawings remain the same.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a field-effect transistor in an integrated circuit, comprising the steps of:
   (a) providing a semiconductor substrate having a surface;
   (b) forming a gate electrode over said surface, said gate electrode having a gate width and sidewalls along its width direction;
   (c) forming first sidewall spacers having a first lateral extension along said sidewalls of said gate electrode;
   (d) removing portions of said semiconductor substrate adjacent said first sidewall spacers, using said first sidewall spacers as a masking material for defining trenches and an active region;
   (e) forming device insulation features in said trenches by overfilling said trenches with insulating material, polishing said insulating material back until a gate cover layer that has been previously formed above the gate electrode is exposed, and etching said insulating material isotropically back;

(f) removing said first sidewall spacers; and (g) performing at least one ion implantation process to form source and drain regions between said gate electrode and said device insulation features.

2. A method according to claim 1, further comprising removing substantially all of said sidewall spacer except portions positioned along a width of said gate electrode prior to step (d) of claim 1.

3. A method according to claim 2, wherein removing a portion of said sidewall spacers includes patterning a lithographic mask over said gate electrode and said first sidewall spacers and etching all exposed parts not covered by the lithographic mask.

4. A method according to claim 3, wherein after removing portions of said sidewall spacers, material of said semiconductor substrate adjacent said sidewalls of said gate electrode is removed.

5. A method according to claim 1, wherein the step of forming said device insulation features comprises filling said trenches with insulating material.

6. A method according to claim 1, wherein the step of forming the device insulation features comprises growing a thin thermal oxide film in said trenches for the benefit of trench corner rounding.

7. A method of forming a field-effect transistor in an integrated circuit comprising the steps of:

(a) providing a semiconductor substrate having a surface;

(b) forming a thin insulating layer over said surface;

(c) forming a gate electrode over said thin insulating layer, said gate electrode having a gate length direction and sidewalls along a gate width direction;

(d) forming a gate cover layer over said gate electrode and first sidewall spacers along said sidewalls of said gate electrode, said first sidewall spacers having a first lateral extension;

(e) masking and etching said gate cover layer and said first sidewall spacers so as to remove the first sidewall spacers along the gate length direction while maintaining the first sidewall spacers along the gate width direction;

(f) removing material of said semiconductor substrate adjacent said first sidewall spacers and said gate electrode, using said first sidewall spacers and said gate cover layer as a masking material for defining trenches and an active region;

(g) growing a thin thermal oxide film in said trenches for the benefit of trench corner rounding;

(h) filling said trenches with insulating material;

(i) polishing said insulating material back until the gate cover layer is exposed;

(j) etching said insulating material isotropically back;

(k) removing said gate cover layer and said first sidewall spacers;

(l) forming second sidewall spacers along said sidewalls of said gate electrode, said second sidewall spacers having a second lateral extension which is less than said first lateral extension; and (m) forming source and drain regions in said active region.

8. A method of forming a field-effect transistor in an integrated circuit, comprising the steps of:

(a) providing a semiconductor substrate having a surface;

(b) forming a gate electrode over said surface, said gate electrode having a gate width and sidewalls along its width direction;

(c) forming first sidewall spacers having a first lateral extension along said sidewalls of said gate electrode;

(d) removing portions of said semiconductor substrate adjacent said first sidewall spacers, using said first sidewall spacers as a masking material for defining trenches and an active region;

(e) forming device insulation features at said trenches; and (f) forming source and drain regions in said active area by performing a process that comprises trimming said first sidewall spacers to form second sidewall spacers having a second lateral extension which is less than said first lateral extension.

9. The method according to claim 8, wherein forming said source and drain regions comprises performing an oblique implantation of ions under said sidewall spacers.

10. The method according to claim 8, wherein forming said source and drain regions comprises performing a diffusion process to diffuse ions under said second sidewall spacers.

11. A method of forming a field-effect transistor in an integrated circuit, comprising the steps of:

(a) providing a semiconductor substrate having a surface;

(b) forming a gate electrode over said surface, said gate electrode having a gate width and sidewalls along its width direction;

(c) forming first sidewall spacers having a first lateral extension along said sidewalls of said gate electrode;

(d) removing portions of said semiconductor substrate adjacent said first sidewall spacers, using said first sidewall spacers as a masking material for defining trenches and an active region;

(e) forming device insulation features at said trenches; and (f) forming source and drain regions in said active area by performing a process that comprises removing said first sidewall spacers and forming second sidewall spacers along said sidewalls of said gate electrode having a second lateral extension which is less than said first lateral extension.

12. The method according to claim 11, wherein between removing said first sidewall spacers and forming said second sidewall spacers, lightly doped source and drain regions are formed by implantation of ions at low dose and energy into said active region.

13. A method of forming a field-effect transistor in an integrated circuit, comprising the steps of:

(a) providing a semiconductor substrate having a surface;

(b) forming a gate electrode over said surface and a gate cover layer above said gate electrode, said gate electrode having a gate width and sidewalls along its width direction;

(c) forming first sidewall spacers having a first lateral extension along said sidewalls of said gate electrode;

(d) removing portions of said semiconductor substrate adjacent said first sidewall spacers, using said gate cover layer and said first sidewall spacers as a masking material for defining trenches and an active region; and (e) forming device insulation features at said trenches.

14. The method according to claim 13, wherein said gate cover layer is removed after forming source and drain regions in said active area.

15. A method, comprising:

forming a gate electrode above a surface of a semiconducting substrate, said gate electrode having a plurality of sidewalls;

forming a gate cover layer above said gate electrode;

forming sidewall spacers along said sidewalls of said gate electrode;

performing an etching process on said semiconducting substrate using at least said gate cover layer and said sidewall spacers as a mask to thereby define a plurality of trenches in said substrate adjacent said sidewall spacers;

forming an insulating material in said trenches;

removing said sidewall spacers; and performing at least one ion implantation process to form source and drain regions in said substrate between said gate electrode and said insulating material in said trenches.

16. The method according to claim 15, wherein said sidewall spacers are formed by depositing a layer of spacer material and performing an anisotropic etching process.

17. The method according to claim 15, wherein said step of forming an insulating material in said trenches comprises depositing said insulating material in said trenches and performing an etching process to reduce a height of a surface of said insulating material in said trenches to a position that is above a gate insulation layer formed above a surface of said semiconducting substrate.

18. A method, comprising:

forming a gate electrode above a surface of a semiconducting substrate, said gate electrode having a plurality of sidewalls;

forming first sidewall spacers along said sidewalls of said gate electrode, said first sidewall spacers having a first lateral dimension;

performing an etching process on said semiconducting substrate using at least said first sidewall spacers as a mask to thereby define a plurality of trenches in said substrate adjacent said first sidewall spacers;

forming an insulating material in said trenches;

performing an etching process on said first sidewall spacers to trim said first sidewall spacers and thereby form second sidewall spacers having a second lateral dimension that is less than said first lateral dimension; and performing at least one ion implantation process to form source and drain regions in said substrate between said gate electrode and said insulating material in said trenches while said second sidewall spacers are positioned adjacent said gate electrode.

19. The method according to claim 18, wherein said first sidewall spacers are formed by depositing a layer of spacer material and performing an anisotropic etching process.

20. The method according to claim 18, further comprising forming a gate cover layer above said gate electrode, wherein said gate cover layer and said first sidewall spacers act as a mask during said etching process performed to define said trenches.

21. The method according to claim 18, wherein said step of forming an insulating material in said trenches comprises depositing said insulating material in said trenches and performing an etching process to reduce a height of a surface of said insulating material in said trenches to a position that is above a gate insulation layer formed above a surface of said semiconducting substrate.

22. A method, comprising:

forming a gate electrode above a surface of a semiconducting substrate, said gate electrode having a plurality of sidewalls;

forming a gate cover layer above said gate electrode;

forming sidewall spacers along said sidewalls of said gate electrode;

performing an etching process to remove substantially all of said sidewall spacers except portions of said spacers positioned along a width of said gate electrode;

performing an etching process on said semiconducting substrate using at least said gate cover layer and said sidewall spacer portions positioned along said width of said gate electrode as a mask to thereby define a plurality of trenches in said substrate adjacent said sidewall spacer portions; and forming an insulating material in said trenches.

23. The method of claim 22, further comprising:

removing said sidewall spacer portions; and performing at least one ion implantation process to form source and drain regions in said substrate between said gate electrode and said insulating material in said trenches.

24. The method according to claim 22, wherein said sidewall spacers are initially formed by depositing a layer of spacer material and performing an anisotropic etching process.

25. The method according to claim 22, wherein said step of forming an insulating material in said trenches comprises depositing said insulating material in said trenches and performing an etching process to reduce a height of a surface of said insulating material in said trenches to a position that is above a gate insulation layer formed above said surface of said semiconducting substrate.

26. A method, comprising:

forming a gate electrode above a surface of a semiconducting substrate and a gate cover layer above said gate electrode, said gate electrode having a plurality of sidewalls;

forming sidewall spacers along said sidewalls of said gate electrode;

performing an etching process on said semiconducting substrate using at least said gate cover layer and said sidewall spacers as a mask to thereby define a plurality of trenches in said substrate adjacent said sidewall spacers; and forming an insulating material in said trenches by:
  overfilling said trenches with said insulating material;
  polishing said insulating material back until at least a portion of said cover layer is exposed; and
  performing an etching process to reduce a thickness of said insulating material.

27. The method of claim 26, further comprising:

removing said sidewall spacers; and performing at least one ion implantation process to form source and drain regions in said substrate between said gate electrode and said insulating material in said trenches.

28. The method according to claim 26, wherein said sidewall spacers are formed by depositing a layer of spacer material and performing an anisotropic etching process.

29. The method according to claim 26, wherein said etching process performed on said insulating material is performed to reduce a height of a surface of said insulating material in said trenches to a position that is above said gate insulation layer formed above a surface of said semiconducting substrate.

* * * * *